(12) United States Patent
Tilak et al.

(10) Patent No.: US 8,159,002 B2
(45) Date of Patent: Apr. 17, 2012

(54) HETEROSTRUCTURE DEVICE AND ASSOCIATED METHOD

(75) Inventors: Vinayak Tilak, Niskayuna, NY (US); Alexei Vertiatchikh, Schenectady, NY (US); Kevin Sean Matocha, Rexford, NY (US); Peter Micah Sandvik, Clifton Park, NY (US); Siddharth Rajan, Goleta, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/961,532

(22) Filed: Dec. 20, 2007

(65) Prior Publication Data

US 2009/0159929 A1    Jun. 25, 2009

(51) Int. Cl.
*H01L 29/66* (2006.01)
(52) U.S. Cl. ......................................... 257/192; 257/194
(58) Field of Classification Search .................. 257/194, 257/192
See application file for complete search history.

(56) References Cited

U.S. PATENT DOCUMENTS 5,264,380 A * 11/1993 Pfiester .......................... 438/288
6,521,956 B1 * 2/2003 Lee .............................. 257/384
2006/0006413 A1 * 1/2006 Beach ............................ 257/192
2006/0175681 A1 * 8/2006 Li .................................. 257/613
2007/0026587 A1 * 2/2007 Briere ........................... 438/159
2007/0126021 A1 * 6/2007 Ryu et al. ...................... 257/103

FOREIGN PATENT DOCUMENTS

WO    2007062589 A1    6/2007
WO    2007062590 A1    6/2007

OTHER PUBLICATIONS

Song et al., Normally Off AIGaN/GaN Low-Density Drain HEMT (LDD-HEMT) With Enhanced Breakdown Voltage and Reduced Current Collapse, IEEE Electron Device Letters, vol. 28, No. 3, Mar. 2007, 189-191.
R. Neuberger et al., Observation of ion-induced changes in the channel current of high electron mobility AIGaN/GaN transistors (HEMT), Materials Science and Engineering B93 (2002) 143-146.

* cited by examiner

*Primary Examiner* — Kenneth Parker
*Assistant Examiner* — Dale E Page
(74) *Attorney, Agent, or Firm* — Ziolkowski Patent Solutions Group, SC; Jean K. Testa

(57) ABSTRACT

A heterostructure device includes a semiconductor multi-layer structure that has a first region, a second region and a third region. The first region is coupled to a source electrode and the second region is coupled to a drain electrode. The third region is disposed between the first region and the second region. The third region provides a switchable electrically conductive pathway from the source electrode to the drain electrode. The third region includes iodine ions. A system includes a heterostructure field effect transistor that includes the device.

17 Claims, No Drawings

HETEROSTRUCTURE DEVICE AND ASSOCIATED METHOD

TECHNICAL FIELD

The invention includes embodiments that relate to a semiconductor heterostructure device. The invention includes embodiments that relate to a method of making and/or using the power semiconductor device.

DISCUSSION OF ART

A semiconductor material for high power applications may need good thermal properties, high breakdown voltage, chemical inertness, mechanical stability and the ability to be fabricated as either a unipolar device or a bipolar device. Some currently available semiconductor materials for use as a power device may include silicon or gallium arsenide.

A field-effect transistor (FET) may rely on an electric field to control the conductivity of a "channel" that is defined in the semiconductor material. A FET, like all transistors, may be thought of as a voltage-controlled current source. Some FETs may use a single-crystal semiconductor wafer as the channel, or active region. A terminal in a FET may be one of a gate, a drain, or a source. The voltage applied between gate and source terminals may modulate the current between the source and the drain.

A FET that has two or more heterogeneous materials is a heterostructure field effect transistor (HFET), and may be a HEMT (High Electron Mobility Transistor). A HFET, or a HEMT, may be a field effect transistor with a junction between two materials as the channel, where the materials have differing band gaps (i.e., a heterojunction) relative to each other. The junction may create a thin layer where the Fermi energy level is above the conduction band, giving the channel very high electron mobility and leading to low on-state resistance for the channel. This thin layer may be referred to as a two-dimensional electron gas (2DEG). As with other types of FETs, a voltage applied to the gate alters the conductivity of the thin layer. Current commercial HFETs are normally-on, that is, the HFET conducts current even in absence of any potential applied between the gate and the source electrode. Such HFETs may not be practical or desirable in switching devices, such as inverters or converters.

It may be desirable to have a normally-off HFET with high threshold voltage and with high channel charge density. It may be desirable to have a switching device with properties that differ from the properties of available devices.

BRIEF DESCRIPTION

In accordance with an embodiment of the invention, a device is provided. The device includes a semiconductor multi-layer structure that has a first region, a second region and a third region. The first region is coupled to a source electrode and the second region is coupled to a drain electrode. The third region is disposed between the first region and the second region. The third region provides a switchable electrically conductive pathway from the source electrode to the drain electrode. Furthermore, the third region includes iodine ions.

In accordance with an embodiment of the invention, a method is provided that includes implantation of ions into a portion of a surface of a multi-layer structure. Iodine ions are implanted between a first region and a second region to form a third region. A charge is depleted from the two dimensional electron gas (2DEG) channel in the third region to form a reversibly electrically non-conductive pathway from the first region to the second region. On applying a voltage potential to a gate electrode proximate to the third region allows electrical current to flow from the first region to the second region.

DETAILED DESCRIPTION

The invention includes embodiments that relate to a semiconductor device, such as a heterostructure device. The invention includes embodiments that relate to a method of making the device and/or using the device as a power semiconductor device.

Approximating language, as used herein throughout the specification and claims, may be applied to modify any quantitative representation that could permissibly vary without resulting in a change in the basic function to which it may be about related. Accordingly, a value modified by a term such as "about" is not limited to the precise value specified. In some instances, the approximating language may correspond to the precision of an instrument for measuring the value. As used herein, the term "secured to" or "disposed over" or "deposited over" or "disposed between" refers to both direct contact with and to indirect contact by having intervening layers therebetween.

Ion implantation is a materials engineering process by which ions of a material can be implanted into the surface of a solid. The implantation process may change the physical properties of the solid, and may change the chemical composition of the solid. The physical properties that may be affected include a structural change in the crystal structure of the solid. The chemical change can be due to chemical interaction of the implanted ion with the crystalline material of the solid. The solid referred to herein is an inorganic material.

"Threshold voltage" is a minimum gate source voltage required for conduction of source-drain current for a normally-off device. Normally-off indicates that a circuit is open from one predetermined point to another unless an external stimulus is provided to close the circuit and turn the device "on". For example, a voltage less than the threshold voltage applied to a gate electrode may not allow electrical communication from a source electrode to a drain electrode. As used herein, the term "normally-off" refers to a device in which negligible or no current flows in the absence of an applied electrical potential to a proximate gate electrode.

According to one embodiment, a device having a semiconductor multi-layer structure is provided. The multi-layer structure includes a first region, a second region and a third region. The first region is coupled to a source electrode and the second region is coupled to a drain electrode. The third region is disposed between the first region and the second region, that is the first region and the second region are spaced apart by the third region. The third region provides a switchable electrically conductive pathway from the source electrode to the drain electrode. The third region includes iodine ions.

The multi-layer structure may include an AlGaN/GaN layered heterostructure. In one embodiment, the layered heterostructure may have a plurality of layers. In another embodiment, the heterostructure may have a first layer and a second layer. The first layer may be formed of gallium nitride, defining a first bandgap and the second layer, adjacent to the first layer may be formed of aluminum gallium nitride having a second bandgap that differs from the first bandgap. In one embodiment, the first layer may be a buffer layer and the second layer may be a barrier layer. The first layer may have a first surface and a second surface. Additionally, at least a portion of the first surface of the first layer may be coupled to a surface of the second layer. The difference in the bandgap of the first and second layers may act as a potential barrier. The potential barrier may provide quantum confinement of charges, such as electrons, to form a two-dimensional electron gas. The two-dimensional electron gas may form at the interface between the two layers.

The 'two-dimensional electron gas' is a planar region or channel of high charge and high mobility electrons and may be responsible for charge flow in a device. In nitride-based devices, this charge flow effect may be enhanced by a polarization effect.

The first layer may include one or more dopants. If the first layer is p-doped, the dopants may include magnesium, or carbon, or both. If the first layer is n-doped, the dopants may include silicon, magnesium, oxygen, carbon, calcium, iron or combinations of two or more thereof. The density of the two-dimensional electron gas may be controlled by controlling the number of free charges in the doped first layer. That is, the density of the two dimensional electron gas may be controlled by controlling the doping concentration of the first layer.

The dislocation density of the first layer may be in a range of from about 1 per centimeter square to about $10^6$ per centimeter square, from about $10^6$ per centimeter square to about $10^8$ per centimeter square, and from about $10^8$ per centimeter square to about $10^9$ per centimeter square, from about $10^9$ per centimeter square to less than about $10^{11}$ per centimeter square. The higher values of dislocation density may result in leakage currents, thereby reducing the efficiency of the device.

The thickness of the first layer may vary from about 1 micrometer to about 2 micrometers, from about 2 micrometers to about 3 micrometers, from about 3 micrometers to about 4 micrometers, from about 4 micrometers to about 5 micrometers, or from about 5 micrometers to about 10 micrometers. The thickness of the second layer may be in a range of from about 100 Angstroms to about 200 Angstroms, from about 200 Angstroms to about 400 Angstroms, from about 400 Angstroms to less than about 500 Angstroms. In one embodiment, the thickness of the second layer may be about 100 Angstroms.

In embodiments of the invention, the second layer may be doped. The second layer may be n-doped to provide two dimensional electron gas at the interface of the first layer and the second layer. In one embodiment, the dopants may include silicon, oxygen, or both. Alternatively, the second layer may be p-doped to provide two dimensional hole gas at the interface. In one embodiment, the dopants may include one or more of magnesium, carbon, calcium, or a combination of two or more thereof.

In some embodiments, a portion of the second layer may be doped. Such doping may induce two dimensional electron gas at the interface of the first layer and the portion of the second layer that is doped. For example, a portion of the second surface of the second layer, that is, the surface opposite the surface coupled to the first layer, may be doped. A portion of the second layer lying between the second surface of the second layer and up to a predetermined thickness, as measured from the second surface, may be doped. The doping may produce free charges in the second layer to induce two dimensional electron gas at the interface of the first and second layers. The thickness of the doping region, or depth of doping penetration, as measured from the second surface may be less than about 50 Angstroms, or in a range of from about 50 Angstroms to about 100 Angstroms, from about 100 Angstroms to about 200 Angstroms, from about 200 Angstroms to about 300 Angstroms, greater than about 300 Angstroms.

Doping concentration may be greater than about $10^{19}$ per centimeter cube, or in a range of from about $10^{19}$ per centimeter cube to about $10^{20}$ per centimeter cube.

The device may further include a semiconductor substrate. The layered heterostructure may be formed on, secured to, or otherwise include the substrate. The substrate may provide mechanical support to the device. In one embodiment, the substrate may be electrically semi insulating. In another embodiment, the substrate may be electrically conducting. A suitable substrate may contain one or more metal or metalloid, such as silicon, aluminum, or gallium. These substrates may be oxides, carbides, nitrides, silicides, aluminides, and the like. Suitable materials for the substrate may include silicon carbide, aluminum oxide, aluminum nitride, gallium nitride, lithium aluminum oxide, or lithium gallium oxide. In one embodiment, the aluminum oxide is in the form of sapphire.

The substrate may be coupled to at least a portion of the second surface of the first layer. The lattice constant of the semiconductor substrate and the first and/or second layer may be matched to reduce the number of surface defects. Surface defects may include micro-cracks formed at an interface with the substrate.

The first region and the second region may provide Ohmic contacts to the device. The first region may be coupled to a source electrode and the second region may be coupled to a drain electrode. The second region may not be in electrical communication with the first region if no electrical potential is applied to a gate electrode, and an electrical potential applied to the gate electrode may allow electrical communication from the first region to the second region.

Etching away a part of the layered heterostructure may form the first and second regions. Suitable methods to etch the first and the second regions may include chlorine-based plasma etching, and ion implantation. Etching may be done in the presence of an inert gas, such as helium, useful for cooling.

The source electrode and the drain electrode may be formed separately. The source and the drain electrodes may be formed by depositing a metal on the device in contact to the first region and the second region, respectively. Metal may be deposited on the device, by employing techniques, such as sputtering. Subsequently, the metal may be patterned or etched to form the electrodes.

The first and the second regions are spaced apart by a third region. The third region may be interposed between, and adjacent to, the first and the second regions. In one embodiment, the first region may communicate with the second region via the third region in response to the electrical potential being applied to a gate electrode. The gate electrode may be directly coupled to a portion of the third region. That is, the gate electrode may be placed between the source electrode and the drain electrode. The gate electrode may control a current flowing between the source electrode and the drain electrode. The current may not flow between the source electrode and the drain electrode until a voltage is applied to the gate electrode. Suitable materials for the gate electrode may include nickel, aluminum, copper, palladium, palladium silicon, platinum, or gold, or an alloy of the foregoing.

The third region may provide a switchable electrically conductive pathway from the first region to the second region or from the source electrode to the drain electrode. In one embodiment, the switchable electrically conductive pathway may be a two dimensional electron gas channel that is responsible for electrical communication between the source and the drain electrode. In another embodiment, the switchable electrically conductive pathway may be charge depleted and thus does not allow any electrical communication between the source and the drain electrode without applying a voltage to the gate electrode.

The third region may include ions. As used herein, the term ions used in conjunction with the third region refers to iodine, bromine, or iodine and bromine together or with other halide ions. In one embodiment, the ions consist essentially of iodine. The ions may deplete the charge within the switchable electrically conductive pathway, that is, the iodine ions may deplete the two-dimensional electron gas and form a reversibly electrically non-conductive pathway from the first region to the second region. However, application of a voltage potential to the gate electrode may allow electrical current to flow from the first region to the second region, that is, switch to the electrically conductive pathway. The depletion of the two dimensional electron gas due to the presence of iodine ions within the third region may raise the conduction band from Fermi level and may provide a positive threshold voltage to create a normally-off device or an enhancement mode device.

The ions may be incorporated into the third region on top surface of the multi-layer structure. In one embodiment, the iodine ions may be incorporated into the top surface of the aluminum gallium nitride barrier layer. Suitable methods that can be used for disposing the ions into the top surface of the multi-layer structure include ion implantation and plasma deposition. In one embodiment, the ions may be implanted by an ion injection method. The ions may be incorporated by a plasma treatment. In such embodiments, the ions may be implanted before or after depositing the gate electrode.

The Threshold Voltage of the device may depend on the depletion of the two-dimensional electron gas, which further depends on the concentration of the implanted iodine ions and the depth of the iodine ions from the top surface. The increased iodine ion concentration leads to a reduced electron density in the channel and provides a positive shift of threshold voltage. For example, a controlled amount of the implanted iodine ions and the depth of the ions from the top surface may completely deplete the two-dimensional electron gas channel and provide high threshold voltage.

The concentration of the implanted ions within the third region may be less than about $1 \times 10^{19}$ cm$^{-3}$. In one embodiment, the concentration of the implanted iodine ions may be in a range of from about $1 \times 10^{13}$ cm$^{-3}$ to about $1 \times 10^{14}$ cm$^{-3}$, from about $1 \times 10^{14}$ cm$^{-3}$ to about $1 \times 10^{15}$ cm$^{-3}$, from about $1 \times 10^{15}$ cm$^{-3}$ to about $1 \times 10^{16}$ cm$^{-3}$, from about $1 \times 10^{16}$ cm$^{-3}$ to about $1 \times 10^{17}$ cm$^{-3}$, from about $1 \times 10^{17}$ cm$^{-3}$ to about $1 \times 10^{18}$ cm$^{-3}$, from about $1 \times 10^{18}$ cm$^{-3}$ to about $1 \times 10^{19}$ cm$^{-3}$.

The implanted ions may penetrate to a depth of less than about 200 Angstroms from the surface. The average penetration depth may be referred to as the range of ions. In one embodiment, the depth of the implanted iodine ions may be in a range of from about 50 Angstroms to about 100 Angstroms, from about 100 Angstroms to about 150 Angstroms, or from about 150 Angstroms to about 200 Angstroms.

The implantation process may be followed with an annealing step to repair damage to the crystalline structure caused by the implantation. The iodine ions are less mobile due to their heavier atomic weight compared to other same group ions. The iodine ions being more stable may provide stability to the threshold voltage at high temperatures. Thus, the device may be suitable for high power and high temperature applications.

The presence of the ions within the third region may electrically turn off the channel completely and thus switch the device from Normally-on to Normally-off. Little to no electric current flows between the source electrode and the drain electrode through the two-dimensional electron gas channel until a sufficiently high electric potential is applied to the gate electrode. The presence of applied potential to the gate electrode may cause the two dimensional electron gas to extend and form a continuous electrically conductive channel between the source electrode and the drain electrode. This is reversible electrical coupling of the source electrode and the drain electrode. By way of contrast, an off-mode of operation would have an electrical discontinuity from the source electrode to the drain electrode via the two dimensional electron gas.

The device is a normally-off heterostructure field effect transistor (HFET) in accordance with an embodiment. A suitable HFET may have an On-Resistance that is greater than about 0.1 milliohm per centimeter squared. In one embodiment, the On-Resistance of the HFET may be in a range of from about 0.1 milliohm per centimeter square to about 1 milliohm per centimeter square, from about 1 milliohm per centimeter square to about 10 milliohm per centimeter square, from about 10 milliohm per centimeter square to about 50 milliohm per centimeter square, or from about 50 milliohm per centimeter square to about 100 milliohm per centimeter square.

The HFET may have a blocking voltage that is more than about 100 volts. The blocking voltage of a device may be defined as a maximum voltage that a device may withstand before breaking down. The blocking voltage of the device may be in a range of from about 100 volts to about 250 volts, from about 250 volts to about 500 volts, from about 500 volts to about 750 volts, from about 750 volts to about 1000 volts, from about 1000 volts to about 1250 volts, from about 1250 volts to about 1500 volts, from about 1500 volts to about 2000 volts, from about 2000 volts to about 5000 volts, from about 5000 volts to about 25000 volts, from about 25000 volts to about 50000 volts, or greater than about 50,000 volts.

Normally-off devices may be desirable for high power applications, such as high power, high temperature and high frequency applications. For switching devices, such as inverters or converters, a normally off type device having a low On resistance may be desirable, because of their low leakage current. The low leakage currents may result in improved efficiency and increased device reliability. Embodiments of the invention may be useful in, for example, a power diode, thyristor, power MOSFET, power MISFET, or an IGBT (insulated gate bipolar transistor).

Ion implantation equipment suitable for use with at least one embodiment of the invention may include an ion source, an accelerator, and a target chamber. The ion source produces ions of the desired type and concentration, for example, iodine ions. The accelerator uses a high-energy electrostatic charge to impart velocity and direction to the ions. The target chamber holds the solid into which the ions are implanted. Each ion may be a single atom, so that the actual amount of material implanted is the integral over time of the ion current. In one embodiment, the larger atomic size of iodine, relative to, for example, chlorine, may lead to selection of relatively lower ionization energies to keep physical damage to the implanted solid to a minimum.

Suitable ion implantation equipment may include the iStar low energy and high current Ion Implanter, commercially available from Advanced Ion Beam Technology, Inc. (San Jose, Calif.); the Optima XE Single Wafer High Energy Ion Implanter that is commercially available from Axcelis Technologies, Inc. (Beverly, Mass.); and the VIISta series ion implanters commercially available from Varian Semiconductor Equipment Associates, Inc. (Gloucester, Mass.) (VSEA).

In one embodiment, mesotaxy process grows a cystallographic matching phase underneath the multi-layered structure surface using relatively high energy and dose. The temperature in the target chamber is controlled to reduce or eliminate crystalline structure damage.

EXAMPLES

Example 1

Forming Normally-Off Heterostructure Field Effect Transistor

A normally-off nitride-based heterostructure field effect transistors (HFET) is formed. A 2-micron thick GaN buffer layer is formed on a sapphire substrate. A 100-Angstrom thick barrier layer is epitaxially grown on the GaN buffer layer. The barrier layer includes aluminum gallium nitride (AlGaN).

The structure has a source Ohmic contact pad and a drain Ohmic contact pad attached to the surface of the barrier layer. A silicon dioxide mask covers the source and drain Ohmic contact pads, and covers a portion of the barrier layer. The structure is mounted in the implantation chamber. The implantation chamber is maintained at room temperature and a pressure of less than $10^{-6}$ Torr. An iodine source (sodium iodide) provides the iodine ions. The iodine ion beam is directed normal to the structure. The iodine ions are sputtered or shot onto the surface of the mast, and through the barrier layer surface into the body of the barrier layer not covered by the mask. Iodine ions are implanted into the top surface of AlGaN barrier layer between the source and drain Ohmic contact pads using 10 keV implant energies and implant iodine ion dose of $10^{14}$ cm$^{-2}$.

The mask is removed after implanting the iodine ions. The source, drain and gate electrodes are formed by a metallization deposit. Particularly, the source electrode is formed on the source contact pad, the drain electrode is formed on the drain contact pad, and the gate electrode is formed proximate to the reversibly electrically non-conductive channel disposed between the source electrode and the drain electrode. The GaN layer and AlGaN layer interface define a two-dimensional electron gas (2DEG). The portion of the interface proximate to the implanted iodine ions depletes the electron charge in that area.

There is a positive threshold voltage required to overcome the depleted area's (third zone) electrically non-conductive disposition (normally off mode). Application of a voltage potential to the gate electrode overcomes the threshold voltage requirement and switches the depleted area's (third zone) electrically non-conductive disposition to electrically conductive to close the circuit from the source electrode to the drain electrode.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. A device, comprising:
a semiconductor multi-layer structure including a first layer comprising a buffer layer and a second layer comprising a barrier layer, the semiconductor multi-layer structure having a first region coupled to a source electrode, a second region coupled to a drain electrode, and a third region disposed between the first region and the second region, wherein the third region is coupled to a gate electrode and provides a switchable electrically conductive pathway from the source electrode to the drain electrode, and wherein the third region comprises iodine ions implanted into the barrier layer of the semiconductor multi-layer structure;
wherein the barrier layer comprises an epitaxially grown aluminum gallium nitride layer and the buffer layer comprises a gallium nitride layer; and
wherein the third region comprises iodine ions implanted into the aluminum gallium nitride layer so as to provide a switchable electrically conductive pathway from the source electrode to the drain electrode.

2. The device as defined as in claim 1, wherein the multi-layer structure comprises an $Al_{(x)}Ga_{(1-x)}N/Al_{(y)}Ga_{(1-y)}N$ layered heterostructure, and x and y are each a number from 0 to 1.

3. The device as defined as in claim 1, wherein the switchable electrically conductive pathway defines a two-dimensional electron gas channel.

4. The device as defined as in claim 1, wherein the third region is charge depleted.

5. The device as defined as in claim 1, wherein the iodine ions implanted into the barrier layer of the semiconductor multi-layer structure deplete a charge within the switchable electrically conductive pathway.

6. The device as defined as in claim 1, wherein the concentration of the iodine ions in the third region is in a range of from about $1\times10^{13}$ cm$^{-3}$ to about $1\times10^{15}$ cm$^{-3}$.

7. The device as defined as in claim 1, wherein the barrier layer of the semiconductor multi-layer structure comprises an annealed layer.

8. The device as defined as in claim 1, wherein the iodine ions are implanted into a body of the barrier layer.

9. The device as defined as in claim 1, wherein the source electrode and the drain electrode comprise sputtered metal electrodes.

10. The device as defined as in claim 1, wherein the epitaxially grown aluminum gallium nitride layer has a thickness of 100 Angstroms.

11. A semiconductor device comprising:
a semiconductor multi-layer structure having a plurality of semiconductor layers, the semiconductor multi-layer structure comprising:
a gallium nitride layer; and
an aluminum gallium nitride layer disposed on the gallium nitride layer;
a source electrode positioned on the semiconductor multi-layer structure at a first region of the aluminum gallium nitride layer;
a drain electrode positioned on the semiconductor multi-layer structure at a second region of the aluminum gallium nitride layer; and
a gate electrode positioned on the semiconductor multi-layer structure at a third region of the aluminum gallium nitride layer, the third region being disposed between the first region and the second region;
wherein the third region of the aluminum gallium nitride layer comprises iodine ions implanted into the aluminum gallium nitride layer so as to provide a switchable electrically conductive pathway from the source electrode to the drain electrode.

12. The semiconductor device of claim 11 wherein the semiconductor multi-layer structure has a bandgap of greater than 2 electronvolts.

13. The semiconductor device of claim 11 wherein the third region of the aluminum gallium nitride layer further comprises ions of chlorine, bromine, fluorine, or a combination of two or more thereof.

14. The semiconductor device of claim 11 wherein the iodine ions are implanted into a body of the aluminum gallium nitride layer.

15. The semiconductor device of claim 11 wherein the aluminum gallium nitride layer has a thickness of 100 Angstroms.

16. The semiconductor device of claim 11 wherein the source electrode and the drain electrode comprise sputtered metal electrodes.

17. The semiconductor device of claim 11 wherein the switchable electrically conductive pathway defines a two-dimensional electron gas channel.

* * * * *